United States Patent [19]

Masumi

[11] Patent Number: 5,445,766
[45] Date of Patent: Aug. 29, 1995

[54] SUPERCONDUCTIVE CONJUGATE PHOTOCONDUCTIVE SUBSTANCES OF THE BI-SRCA(LAY)-CU-O SYSTEM, A METHOD FOR PRODUCING THE SAME AND SUPERCONDUCTIVE OPTOELECTRONIC DEVICES USING THE SAME

[75] Inventor: Taizo Masumi, Yokohama, Japan

[73] Assignee: The University of Tokyo, Tokyo, Japan

[21] Appl. No.: 913,431

[22] Filed: Jul. 15, 1992

[30] Foreign Application Priority Data

Jul. 16, 1991 [JP] Japan .................. 3-199922

[51] Int. Cl.$^6$ .................. H01B 1/00; H01B 1/06; H01B 1/08; H01B 12/00
[52] U.S. Cl. .................. 252/518; 252/521; 505/100; 505/782; 505/775; 505/776; 505/777; 505/778; 505/779
[58] Field of Search .................. 505/782, 1, 775, 776, 505/777, 778, 779; 252/518, 521

[56] References Cited

U.S. PATENT DOCUMENTS

| 4,843,059 | 6/1989 | Deslandes | 252/521 |
| 5,126,316 | 6/1992 | Sleight | 505/782 |
| 5,189,011 | 2/1993 | Itozaki | 505/782 |

FOREIGN PATENT DOCUMENTS

| 0323190 | 7/1989 | European Pat. Off. | 505/782 |
| 0332448 | 9/1989 | European Pat. Off. | |
| 0354811 | 2/1990 | European Pat. Off. | |
| 0354812 | 2/1990 | European Pat. Off. | |
| 1-201058 | 8/1989 | Japan . | |
| 1-201059 | 8/1989 | Japan . | |
| 2-51423 | 2/1990 | Japan . | |
| 2-51424 | 2/1990 | Japan . | |
| 2153822 | 6/1990 | Japan | 505/782 |
| 0137020 | 6/1991 | Japan | 505/782 |
| 3285823 | 12/1991 | Japan | 505/782 |

OTHER PUBLICATIONS

Wakata "Effects of cation substitution on flux pinning . . ." Cryogenics vol. 32 Apr. 1992 pp. 1046–1051.
Murphy "New Superconducting Caprate Perovskites" Phys. Rev Letts vol. 58 May 4, 1987 pp. 1880–1890.
Manthiram "Dependence of $T_c$ on hole concentration . . ." Appl Phys Lett vol. 53(5) Aug. 1, 1988 pp. 420–422.
Physica C, vol. 185–9, 15 Dec. 1991, pp. 967–968, T. Masumi et al, 'Superconductive-Conjugate Photoconductivity of the $Bi_2(Sr_2Ca_1)_{1-x}(La_2Y_1)_xCuO_z$ System'.

Primary Examiner—Paul Lieberman
Assistant Examiner—M. Kopec
Attorney, Agent, or Firm—Sughure, Mion, Zinn, Macpeak & Seas

[57] ABSTRACT

The disclosed substance has a composition of a general chemical formula of $$Bi_2\text{-}(Sr_2Ca_1)_{1-x}(La_2Y_1)_x\text{-}Cu_y\text{-}O_z,$$

where $0.4 \leq x \leq 1$, $y = 2$ and $z = 9\text{--}10.5$, wherein said substance is an insulator or a semiconductor in the dark, and has a photoconductivity $Q(\lambda,T)$ in conjugate with superconductivity of a superconductor of an adjacent component of the Bi-SrCa-LaY-Cu-O system at and below a critical temperature (T) of less than 105–115K and below 65–85K at photoexcitation in an optical wavelength range ($\lambda$) of 420–670 nm. The present invention relates to a method for producing the same and a superconductive optoelectronic device by using the same. The present invention also relates to an organized integration of the element or device into an apparatus to further develop a new field of "Superconductive Optoelectronics."

1 Claim, 13 Drawing Sheets

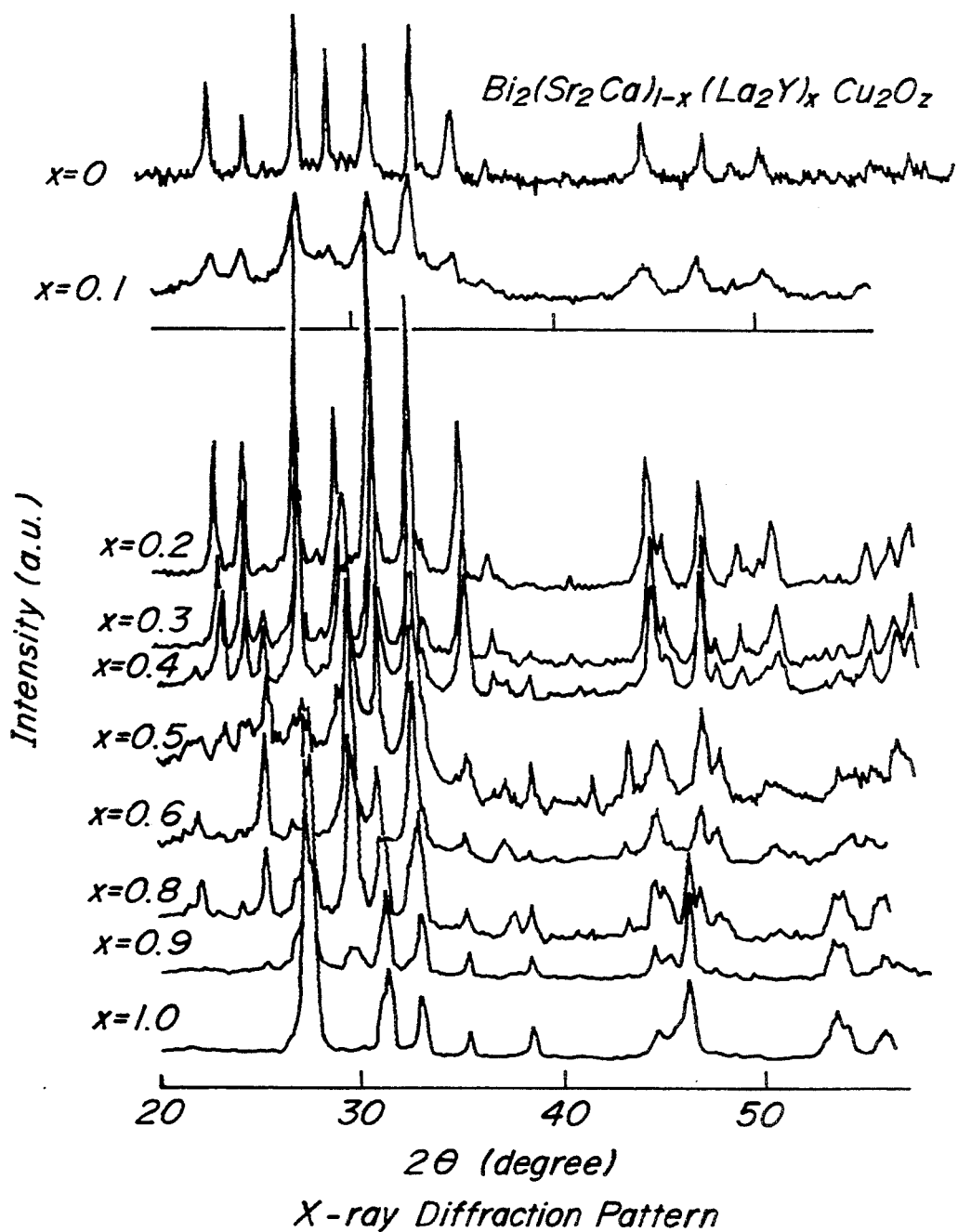

FIG_4A
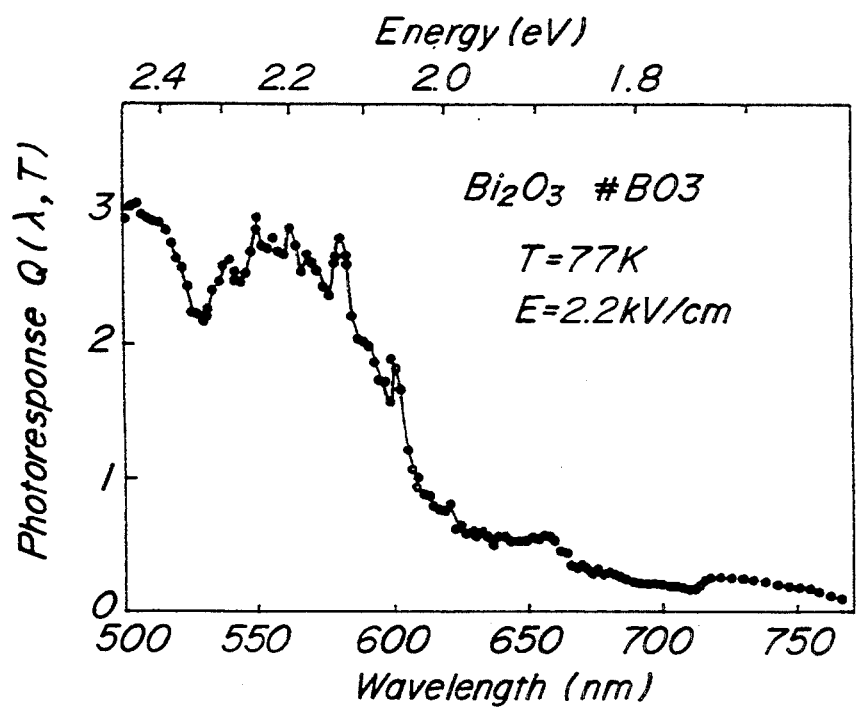
FIG_4B
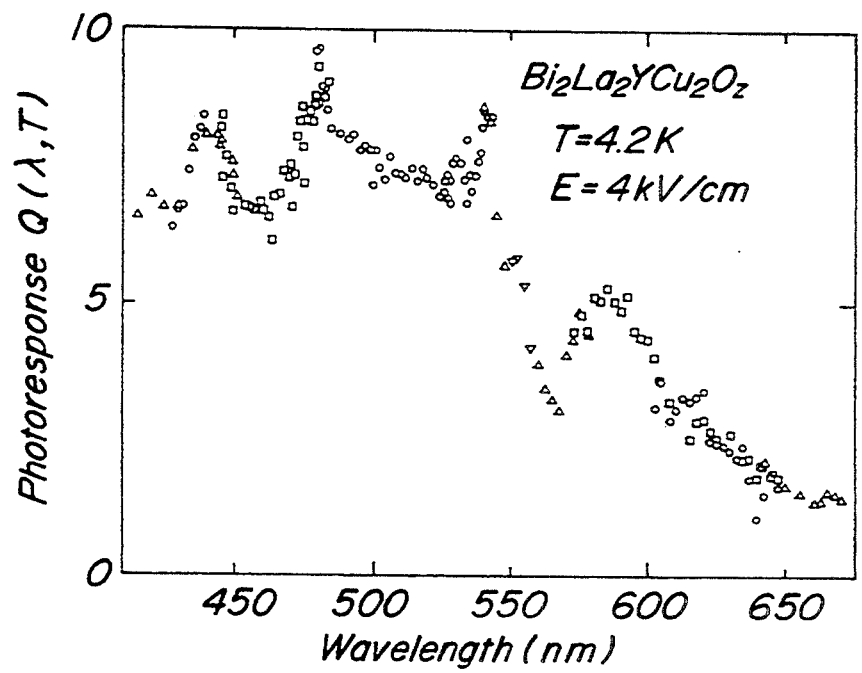

FIG_5A
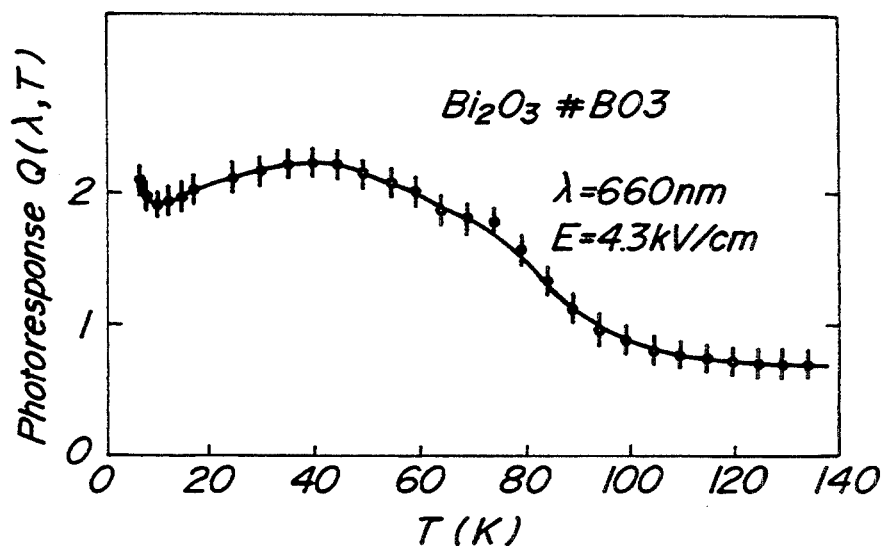
FIG_5B
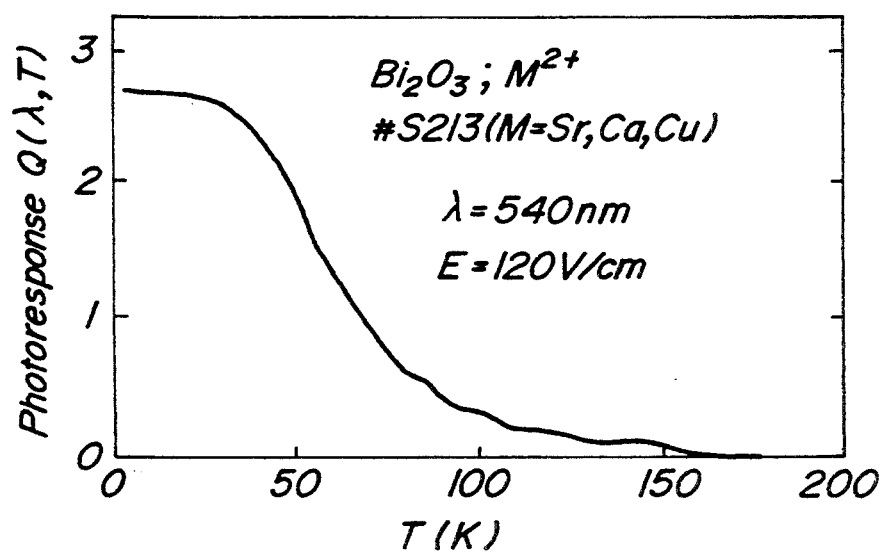

FIG_7
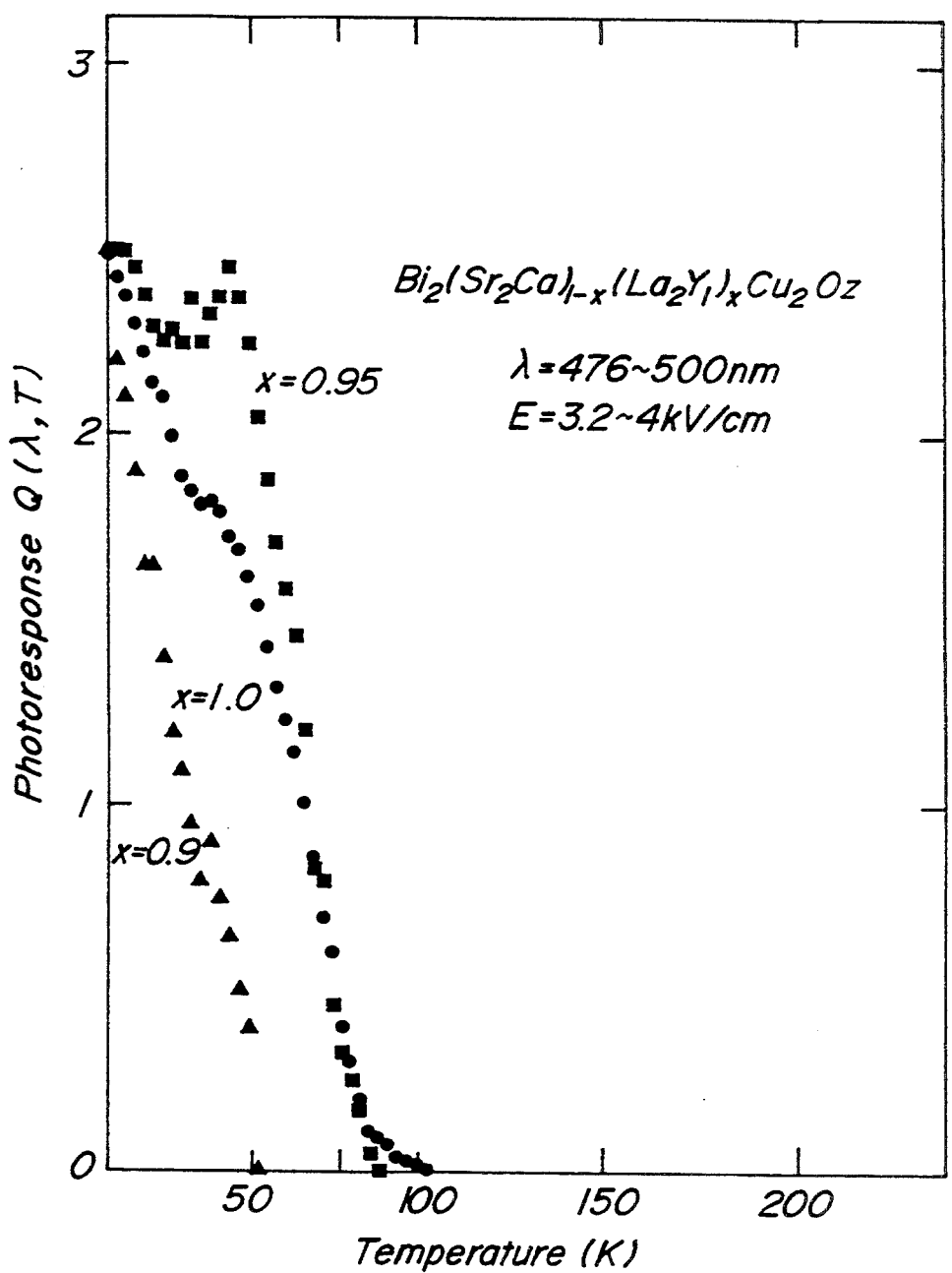

FIG_8
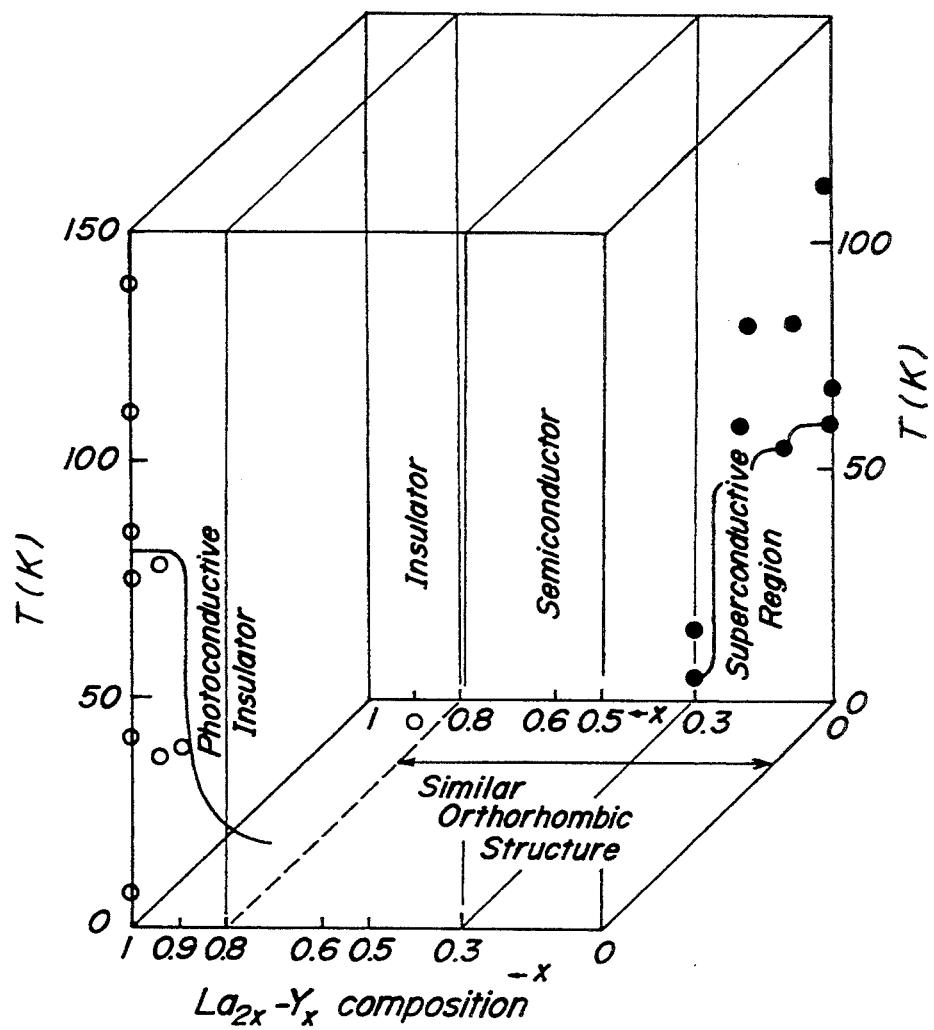

FIG_9
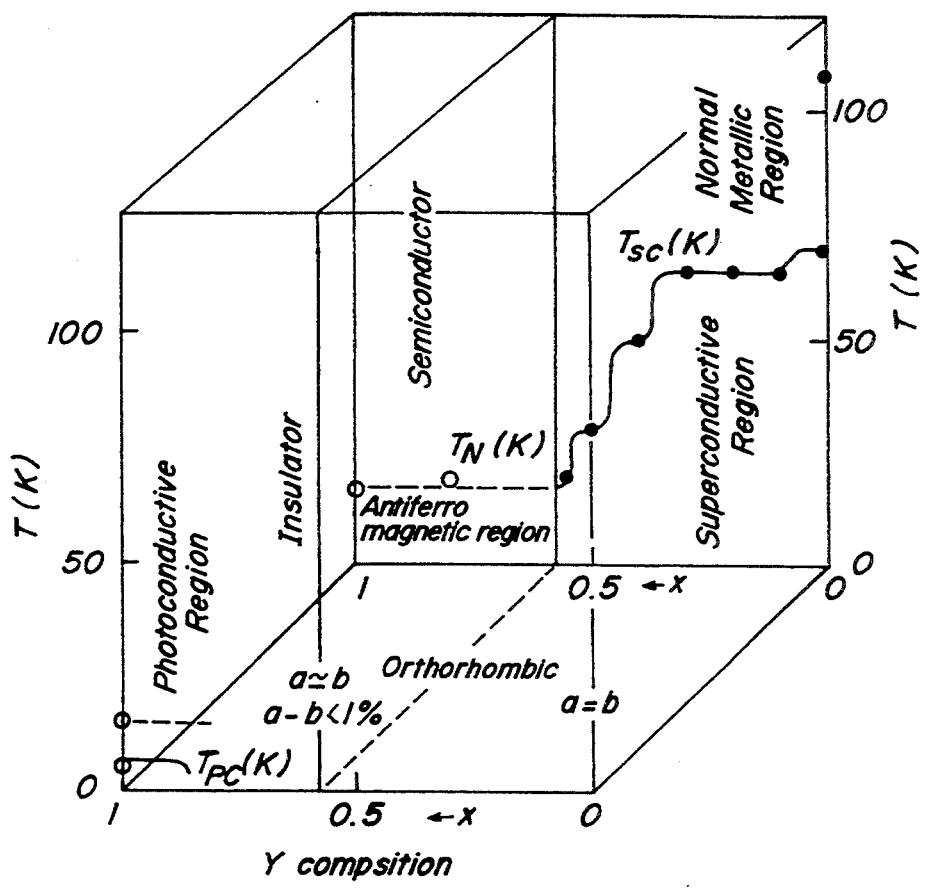

FIG_11
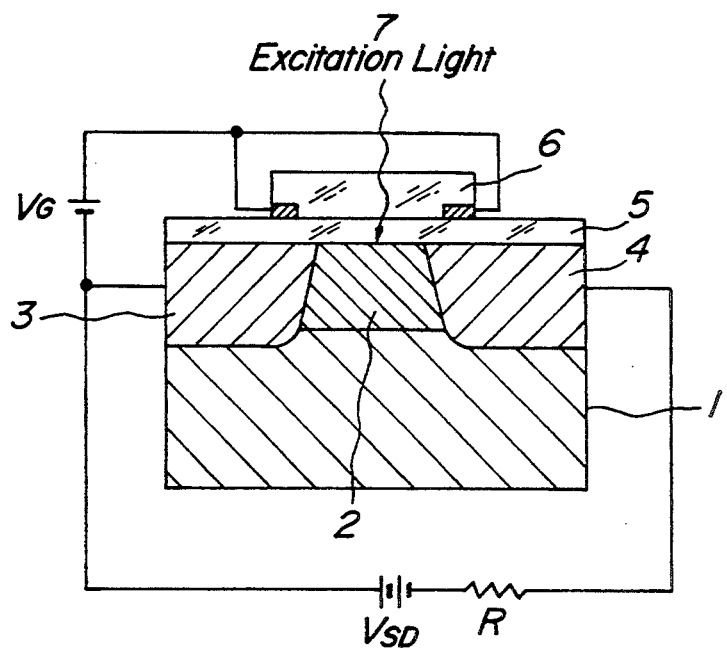
FIG_12
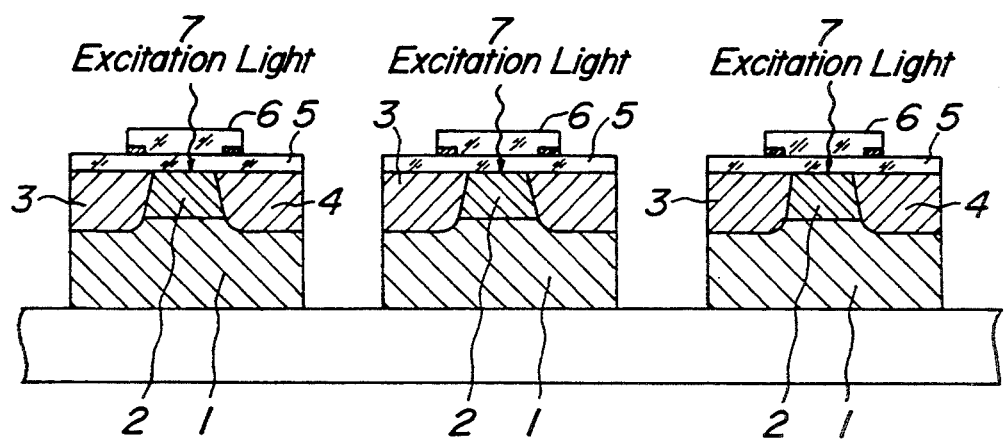

SUPERCONDUCTIVE CONJUGATE PHOTOCONDUCTIVE SUBSTANCES OF THE BI-SRCA(LAY)-CU-O SYSTEM, A METHOD FOR PRODUCING THE SAME AND SUPERCONDUCTIVE OPTOELECTRONIC DEVICES USING THE SAME

BACKGROUND OF THE INVENTION

1. Field of the Invention

The present invention relates to a substance of superconductive conjugate photoconductivity in parallel to superconductivity in a composition range outside the superconductive composition region within the Bi-SrCa(LaY)-Cu-O oxide system and a method for producing the same and a superconductive optoelectronic device with the same.

Here, I define "Superconductive-Conjugate Photoconductivity" to be a substantially new type of large photoconductivity in basic substances or host insulators which emerges in several steps with decreasing temperature in accordance or correspondence with the critical temperatures of superconductivity in relevant conductive substances, all based on the discoveries and inventions disclosed by the present inventor in that "Photoconductivity" and "Superconductivity" are conjugate with each other in a certain group of oxide superconductors.

2. Related Art Statement

The present inventor has presented series of substances having photoconductivity as the substances close to but outside of superconductive region in the prior art, and has already filed patent applications related to substances in the $Y_{3-x}Ba_x$-$Cu_y$-$O_z$ oxide system of superconductive photoconductivity (Japanese Patent Application Laid-open No. Hei-1(1989)-20158), to substance in the $La_2$-$Cu_1$-$O_z$ system of superconductive photoconductivity (Japanese Patent Application Laid-open No. Hei-1(1989)-201059), to substance in the $Ba_1$-$Pb_{1-x}$-$Bi_x$-$O_z$ oxide system of superconductive photoconductivity and a method for producing the same (Japanese Patent Application Laid-open No. Hei-2(1990)-51423) and to substance in the $Ca_{(x-x)}$-$Sr_x$-$Bi_{(y-y)}$-$Cu_y$-$O_z$ oxide system of superconductive photoconductivity and a method for producing the same (Japanese Patent Application Laid-open No. Hei-2(1990)-51424).

Before 1986, superconductive materials have signified essentially metals and alloys thereof. However, recent oxide high temperature superconductors (such as the Y-Ba-Cu-O oxide superconductor) are originally insulators or semiconductor and have been doped by using a large amount of additional elements (such as Ba, Sr) for the purpose of increasing hole density and improving the critical temperature. Therefore, experiments of optical properties in the vicinity of their optically visible range were mainly limited to measurements of optical reflection or scattering by reflecting metallic properties thereof.

An incident light reflects or scatters on the surface of superconductor, but never enters into a superconductor, so that superconductivity and optical properties such as absorption have been usually considered to be irrelevant, except reflection and scattering of light, in domestic scientific societies and international conference abroad.

The reason thereof is because superconductivity are considered to be incompatible physical properties with absorption and photoconductivity and the stability of a superconductor is broken by irradiating light in the wavelength range of shorter than those relevant to the gap energy of the BCS theory. However, there exist reasonably clear correlations between photoconductivity in insulator and superconductivity in the oxide materials such as the Y-Ba-Cu-O, La-Cu-O, Ba-Pb-Bi-O systems of oxide material and the like. Therefore, if a substance having either one or both of deeply correlated superconductivity and photoconductivity is obtained, it becomes possible to utilize it to compose devices such as an optically controllable Josephson element or a superconductive phototransistor and the like and eventually to manufacture apparatus having both properties of machinery and tools of "superconductive computer" based on the presently pursued Josephson element and of "optical computer" proposed by optoelectronics, that is, "superconductive optical computer" and the like.

SUMMARY OF THE INVENTION

The present invention is based on the discovery of photoconductive substances exhibiting a normally unforeseeable photoconductive phenomenon conjugate with superconductivity by performing an experiment of optical properties, particularly high speed pulse photoconductivity, of substance close to but outside the critical composition region of superconductive substance.

In a method for producing the photoconductive material according to the present invention, photoconductive substance of the $Bi_2$-$(Sr_2Ca_1)_{1-x}(La_2Y_1)_x$-$Cu_y$-$O_z$ oxide system having photoconductivity conjugate with superconductivity of the Bi-SrCa(LaY)-Cu-O system (x=0) superconductor can be obtained by controlling a composition ratio x, y and z, thereafter heat treating to select a composition range to be y=2, and approximating to x=1 in $0.4 \leq x \leq 1$ (preferably $0.5 \leq x \leq 1$) or by cooling extremely quickly.

An object of the present invention is to provide a superconductive conjugate photoconductive substance having photoconductivity $Q(\lambda,T)$ at a temperature (T) of less than a critical temperature of corresponding superconductor (i.e. less than 105–115K and less than 65–85K) at photoexcitation of a specified wavelength ($\lambda$) range of 420–670 nm.

The present invention relates to a superconductive conjugate photoconductive substance consisting of a composition having a general chemical formula

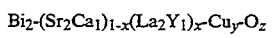

where $0.4 \leq x \leq 1$, y=2 and z=9–10.5, said substance is an insulator or a semiconductor in the dark, having photoconductivity $Q(\lambda,T)$ at a critical temperature (T) of less than 105–115K and less than 65–85K, and photoexcitation of an optical wavelength ($\lambda$) region of 420–670 nm.

Another object of the present invention is to provide a method for producing superconductive conjugate photoconductive substance by heating a starting material consisting of a composition having a general chemical formula

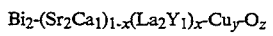

where $0.4 \leq x \leq 1$, y=2 and z=9–10.5, at a temperature of 800°–840° C. for producing a solid phase reaction for 8-15 hours, annealing for 8-15 hours, forming with pressure, thereafter secondarily sintering at 900°-940° C. for 8-15 hours, annealing at a cooling rate of 100°-150° C./H, and obtaining photoconductive substance conjugate with superconductivity.

Further object is to point out that the obtained substance can be expected to be applied to "superconductive optoelectronics" as an industrially applicable field.

The reason why the substance of the present invention is limited to the composition having the general chemical formula is because superconductive conjugate photoconductive substance having the superconductive conjugate temperature dependences and the specified dependences at photoexcitation wavelength even within an insulative composition range can be obtained as substantially shown in embodiment only when the substance within this composition range is heated at a temperature of about 800°-840° C. for producing a solid phase reaction for 8-15 hours, annealed for 8-15 hours, formed with pressure, thereafter secondarily sintered at 900°-940° C. for 8-15 hours, and annealed at a cooling rate of 100°-150° C./H.

The reason of limiting each condition of the method for producing photoconductive substance according to the present invention is explained. A primary sintering step for heating at a temperature of 800°-840° C. for producing a solid phase reaction of starting material compound as described in the general chemical formula $Bi_2$-$(Sr_2Ca_1)_{1-x}(La_2Y_1)_x$-$Cu_y$-$O_z$ where $0.4 \leq x \leq 1$, $y=2$ and $z=9-10.5$, for 8-15 hours and annealing for 8-15 hours and a secondary sintering step after forming under pressure, heating at 900°-940° C. for 8-15 hours and annealing at 100°-150° C./H are necessary steps for completing the solid phase reaction and obtaining a uniform solid phase. Heating at a temperature higher than 1000° C. is not preferable because it is melting. Moreover, heating at less than 900° C. cannot attain an object of completing the solid phase reaction and it is not preferable.

Once such a type of superconductive optoelectronic device is formed with the $Bi_2$-$(Sr_2Ca_1)_{1-x}(La_2Y_1)_x$-$Cu_y$-$O_z$, it must be naturally straightforward to further develop the new field from such a device to other devices; and eventually to superconductive optoelectronic apparatus with the $Bi_2$-$(Sr_2Ca_1)_{1-x}(La_2Y_1)_x$-$Cu_y$-$O_z$ system, for instance a switching device with no power loss, an optically operating device with no power loss, an optically operating logical device, a space parallel type optically operating device, a camera or an image forming device possibly with superconducting wiring, a high-speed optically operating apparatus to be driven at an extremely low power with higher optical efficiency, and the like.

BRIEF DESCRIPTION OF THE DRAWINGS

For a better understanding of the invention, reference is made to the accompanying drawings, in which:

FIG. 1 enumerates experimental results on the variation of powder X-ray diffraction pattern over x to clarify crystalline structure of superconductive conjugate photoconductive substance in the $Bi_2$-$(Sr_2Ca_1)_{1-x}(La_2Y_1)_x$-$Cu_2$-$O_z$ system;

FIG. 4A indicates characteristic data of wavelength dependence of photoconductive response $Q(\lambda,T)$ of the basic substance $Bi_2O_3$, and FIG. 4B indicates characteristic data of a wavelength dependence of photoconductive response $Q(\lambda,T)$ of a specimen of $Bi_2La_2YCu_2O_z$;

FIG. 5A is a characteristic plotting to exemplify the relation between temperature and photoconductive response $Q(\lambda,T)$ of the basic substance $Bi_2O_3$(#B03). FIG. 5B is a characteristic graph showing the relation between temperature and photoconductive response $Q(\lambda,T)$ of the basic substance $Bi_2O_3$:$M^{2+}$(#S213).

FIG. 7 displays characteristic plottings to indicate the temperature dependence of photoconductive response $Q(T,\lambda)$ in the region of $x=0.9-1.0$ of the $Bi_2(Sr_2Ca_1)_{1-x}(La_2Y_1)_xCu_2O_z$ system;

FIG. 8 is a quasi-phase diagram to exhibit the emergence or step temperature Tps of photoconductivity and superconductive transition temperature Tsc of the $Bi_2(Sr_2Ca_1)_{1-x}(La_2Y_1)_xCu_2O_z$ system as a function of x;

FIG. 9 is a similar quasi-phase diagram to exhibit the superconductive transition temperature Tsc and the emergence or step temperature Tps of photoconductivity of the $Bi_2$-$Sr_2$-$Ca_{1-x}Y_x$-$Cu_2$-$O_z$ system as a function of x;

FIG. 11 is a schematic cross section to exemplify an embodiment of the construction of a superconductive optoelectronic element according to the present invention;

FIG. 12 is a schematic diagram to display an embodiment of the construction of the superconductive optoelectronic device according to the present invention.

DETAILED EXPLANATION OF THE PREFERRED EMBODIMENTS

The greater part hitherto known of the Ba-Pb-Bi-O, La-Cu-O, Y-Ba-Cu-O and Bi-Sr-Ca-Cu-O systems of oxide compounds are usually insulators or semiconductors in the ground state, that is, in the dark (i.e. in a dark place condition), particularly at low temperature. Therefore, it is possible to create an elementary excitation by giving a suitable energy with a suitable kinetic momentum above the ground state of these substances. It has been presumed that an elementary excitation exceeding an energy gap merely breaks the ground state of a superconductor in the BCS theory. However, an insulative semiconductor has a possibility of creating an elementary excitation in coherent state in the conduction and/or valence bands such as a bipolaron and an exciton above the ground state even in a thermally non-equilibrium state. These studies have been made in parallel with a study of a superconductor of a high critical temperature Tc. Apart from a trend of the study, however, the present invention has been completed by finding a superconductive conjugate photoconductive substance correlative with a superconductive substance to elicit the photoconductivity $Q(\lambda,T)$ at photoexcitation of the specified range of optical wavelength $\lambda$ at temperature below a critical temperature Tsc outside of the composition of superconductors. This is a new finding in the fields of fundamental physics and applied physics from a novel point of view, that is, from the viewpoint of an elementary excitation concept.

Figure 6:
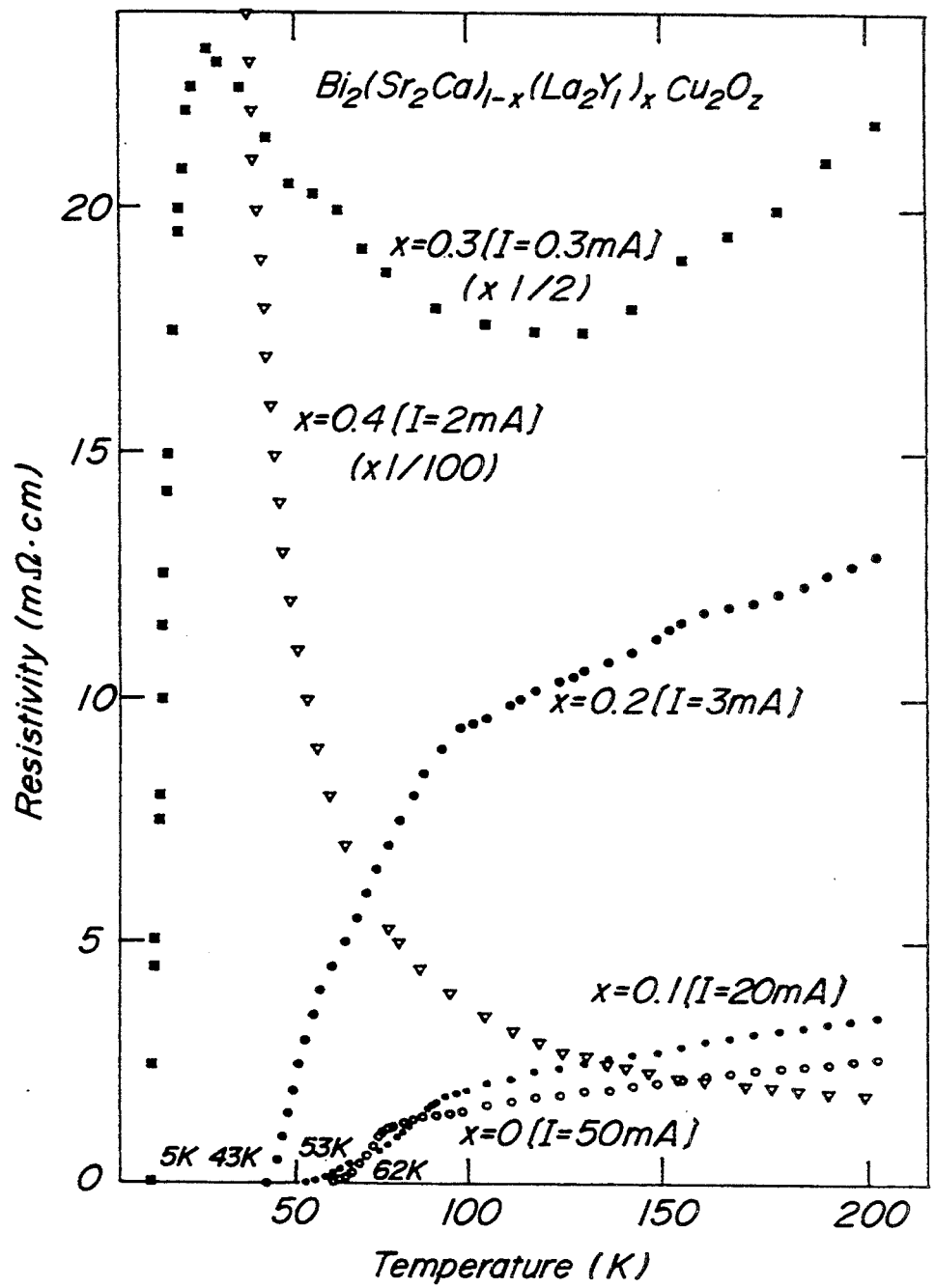
FIG. 6 displays characteristic plottings to indicate the temperature dependence of dark resistivity $\rho(T)$ (m$\Omega$·cm) in the region of $x=0-0.4$ of the $Bi_2(Sr_2Ca_1)_{1-x}(La_2Y_1)_xCu_2O_z$ system.

In the present invention, the reason why the composition of superconductive conjugate oxide photoconductive substance is limited to the general chemical formula $$Bi_2-(Sr_2Ca_1)_{1-x}(La_2Y_1)_x-Cu_yO_z$$

where $0.4 \leq x \leq 1$, $y=2$, and $z=9-10.5$, is because since the composition of $x=0-0.3$ is the condition to be a superconductor, so that the composition of superconductor range $x=0-0.3$ as shown in FIG. 6 is excluded. The inventor studied and examined with the region of substance of $0.4 \leq x \leq 1$ having a composition close to a superconductor and having a temperature dependence of photoconductivity conjugate with superconductivity within a range where the substance does not become a superconductor. The inventor discovered a fact that the substance of an insulator or a semiconductor for $0.4 \leq x \leq 1.0$ in the dark reveals photoconductivity having a temperature dependence in parallel to or conjugate with superconductivity at photoexcitation in a specified wavelength range of 420–670 nm.

The study of the present invention has been initiated on the bases of a fact that, since even $Bi_2O_3$ has photoconductivity to visible light of specified wavelength, $Bi_2O_3$ was recognized as the basic substance. Thus, the inventor examined whether any photoconductive substance conjugate with superconductivity is obtained by adding additional element, and further examined a particular system adding Ca, Sr with Cu and the like to $Bi_2O_3$. As a result, the inventor found a system of photoconductive substance consisting of the composition having the above general chemical formula which composition is close to but outside of a superconductor and inherently an insulator or a semiconductor in the dark and having photoconductivity $Q(\lambda,T)$ conjugate with superconductivity at a temperature (T) of less than the critical temperature of the superconductor at photoexcitation in a specified wavelength range $\lambda$.

The range of $0.4 \leq x \leq 1$, $y=2$, and $z=9-10.5$ in the above general chemical formula $Bi_2-(Sr_2Ca_1)_{1-x}(La_2Y_1)_x-Cu_yO_z$ is a composition for condition of photoconductive substance conjugate with superconductivity of the present invention. Here, when $x=1$, $Bi_2-(La_2Y_1)_1-Cu_yO_z$, and this composition is most suitable for the condition of the present invention.

An embodiment of such photoconductive substance is described. The present inventor has studied a series of specimens in the $Bi_2(Sr_2Ca_1)_{1-x}(La_2Y_1)_x-Cu_yO_z$ system where $0.4 \leq x \leq 1$, $y=2$, and $z=9-10.5$, particularly a variation of the step temperatures $T_{ps}$ in $Q(T,\lambda)$ and $T_{sc}$ in $\rho(T)$ over x, namely, an influence of the composition of lanthanum (La) and yttrium (Y) to form a quasi-phase diagram. Here, the present inventor has performed a systematic study not only of a superconductive phase but also of a semiconductor phase or an insulator phase of the said substance. A large number of specimens of $Bi_2-(Sr_2Ca_1)_{1-x}(La_2Y_1)_x-Cu_yO_z$ system were prepared from the powder of $CaCO_3$, $SrCO_3$, $Bi_2O_3$, CuO, $La_2O_3$ and $Y_2O_3$. The compositions x and y of the starting material were thoroughly examined, and here, it became clear that x can be controlled particularly at the composition of $y=2$. An oxygen content z can also be controlled to some extent by controlling a secondary sintering temperature and a cooling rate. Specimen No. S235 ($x=1$) was prepared by mixing 1.314 g of $Bi_2O_3$, 0.449 g of CuO, 0.918 g of $La_2O_3$ and 0.318 g of $Y_2O_3$ and firing the mixture to be the formula $Bi_2La_2Y_1-Cu_2O_z$. Specimen No. S228 ($x=0.1$) was prepared by mixing 1.329 g of $Bi_2O_3$, 0.758 g of $SrCO_3$, 0.257 g of $CaCO_3$ and 0.453 g of CuO, 0.094 g of $La_2O_3$ and 0.033 g of $Y_2O_3$ and firing the mixture to be the formula $Bi_2(Sr_2Ca_1)_{0.9}(La_2Y_1)_{0.1}Cu_2O_z$, where z shows an oxygen amount, and z changes to $z=9-10.5$ by controlling the firing temperature and cooling rate, thereby differing physical properties of a product obtained.

In the present invention, raw materials were compounded according to a compounding composition ratio, thoroughly stirred, ground, thereafter primarily sintered at 800°–840° C., preferably 820° C. for 8–15 hours preferably over 10 hours to carry out a solid phase reaction, annealed for 8–15 hours, and thereafter the resulting product was used for preparing pellets by forming under pressure. Moreover, these pellets were secondarily sintered at 900°–940° C., preferably 920° C. for 8–15 hours, more preferably over 10 hours, and annealed to room temperature at 100°–200° C./H. In this manner, the former ($x=1$) reveals a superconductive conjugate photoconductive phase of 80K class, while the latter ($x=0.1$) reveals a superconductive phase of $80 \sim 110K$ class.

An embodiment of preparing the similar specimens with the other compositions is as shown in Table 1. Moreover, the informations of their crystal structures are displayed with performing several X-ray analyses in FIG. 1.

TABLE 1

| | | | | | | | | Primary sintering | | | | Secondary sintering | | | |
|---|---|---|---|---|---|---|---|---|---|---|---|---|---|---|---|
| | | | | | | | | 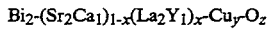 $Bi_2(Sr_2Ca_1)_{1-x}(La_2Y_1)_xCu_2O_z$ | | | | | | | |
| | Speci- | $Bi_2O_3$ | $SrCO_3$ | CaCO | | $La_2O_3$ | | time | | | temperature | time | | | temperature |
| | men | (6N) | (4.5N) | (3N) | CuO(3N) | (4N) | $Y_2O_3$(5N) | (hr) | | | (°C.) | (hr) | | | (°C.) |
| x | No. | (g) | (g) | (g) | (g) | (g) | (g) | (A) | (B) | (C) | (D) | (A) | (B) | (C) | (T) |
| 0.10 | S-228 | 1.329 | 0.758 | 0.257 | 0.453 | 0.094 | 0.033 | 2, | 10, | 10 | (820) | 2, | 10, | 8 | (920) |
| 0.20 | S-229 | 1.360 | 0.690 | 0.234 | 0.464 | 0.190 | 0.066 | 2, | 10, | 10 | (820) | 2, | 10, | 8 | (920) |
| 0.30 | S-230 | 1.351 | 0.599 | 0.203 | 0.461 | 0.283 | 0.098 | 2, | 10, | 10 | (820) | 2, | 10, | 8 | (920) |
| 0.40 | S-231 | 1.347 | 0.512 | 0.178 | 0.460 | 0.376 | 0.131 | 2, | 10, | 10 | (820) | 2, | 10, | 8 | (920) |

TABLE 1-continued $Bi_2(Sr_2Ca_1)_{1-x}(La_2Y_1)_xCu_2O_z$

| | | | | | | | | Primary sintering | | | | Secondary sintering | | |
|---|---|---|---|---|---|---|---|---|---|---|---|---|---|---|
| | Speci-men | $Bi_2O_3$ (6N) | $SrCO_3$ (4.5N) | $CaCO$ (3N) | | $La_2O_3$ (4N) | | time (hr) | | | temper-ature (°C.) | time (hr) | | temper-ature (°C.) |
| x | No. | (g) | (g) | (g) | CuO(3N) (g) | (g) | $Y_2O_3$(5N) (g) | (A) | (B) | (C) | (D) | (A) | (B) | (C) | (T) |
| 0.50 | Y-4 | 1.118 | 0.354 | 0.120 | 0.382 | 0.391 | 0.1.35 | 2, | 10, | 10 | (820) | 2, | 10, | 8 | (290) |
| 0.60 | S-233 | 1.336 | 0.338 | 0.115 | 0.456 | 0.561 | 0.195 | 2, | 10, | 10 | (820) | 2, | 10, | 8 | (920) |
| 0.80 | S-234 | 1.325 | 0.167 | 0.056 | 0.452 | 0.741 | 0.256 | 2, | 10, | 10 | (820) | 2, | 10, | 8 | (920) |
| 0.90 | S-237 | 1.319 | 0.084 | 0.028 | 0.450 | 0.829 | 0.288 | 2, | 10, | 10 | (820) | 2, | 10, | 8 | (920) |
| 0.95 | S-238 | 1.316 | 0.041 | 0.014 | 0.450 | 0.875 | 0.302 | 2, | 10, | 10 | (820) | 2, | 10, | 8 | (920) |
| 1.00 | S-235 | 1.314 | 0 | 0 | 0.449 | 0.918 | 0.318 | 2, | 10, | 10 | (820) | 2, | 10, | 8 | (920) |

Note)
Both primary sintering and secondary sintering were carried out in air. Moreover, indication of A, B, C and D shows the step of heating A (hour), increasing a temperature from room temperature to T (°C.), keeping the temperature for B (hour), and thereafter lowering the temperature to room temperature by taking C (hour).

Experimental Method

A phase diagram of the $Bi_2$-$(Sr_2Ca_1)_{1-x}(La_2Y_1)_x$-$Cu_yO_z$ system oxide compound is a seven-element system, which is not yet complete at a preliminary stage. Particularly important is control of z for the oxygen deficiency corresponding to a set of composition ratios of x and y. In spite of many scientists' remarkable efforts, it will take some more time to completes it. The inventor has been interested in not only a superconductive phase but also a photoconductivity in a semiconductor phase and an insulator phase in the dark. Many specimens of oxide compound in the Bi-(SrCa)(LaY)-Cu-O system were prepared from powder of $Bi_2O_3$, $SrCO_3$, $CaCO_3$, CuO, $La_2O_3$ and $Y_2O_3$. The inventor has studied the composition of material, the annealing and quenching processes and the like in detail, and can control to some extent for oxygen deficiency.

Since specimens of oxide compound in the $Bi_2$-$(Sr_2Ca_1)_{1-x}(La_2Y_1)_x$-$Cu_y$-$O_z$ system are highly insulating at certain values of x,y and z or semiconductive at least at low temperature which are correlative with or conjugate with superconductivity, the inventor adopted two types of techniques for resistivity and/or conductivity measurement in experiment. First, it turned out that the fast pulse technique (see FIG. 2A) with blocking electrodes overcomes several difficult problems in the measurement of an insulating specimen ($\rho \geq 10^8$ $\Omega$·cm), such as Specimen No. S235 at temperatures down to 4.2K from 300K. Moreover, an electrode arrangement of lateral mode was employed, if circumstances require (see FIG. 2B). In measurement, an electric field pulse E was sustained at a certain value up to $E \approx 5$ KV/cm with 10 msec duration in a repetition rate of 13 Hz. Photoexcitation by using a dye laser pulse of 3 nsec in width was synchronized at a suitable time within the time duration of applied electric field pulse (see FIG. 2C).

Second, for a specimen having proper conductivity ($\rho \leq 10^1$ $\Omega$·cm) such as Specimen No. S231, the inventor adopted a usual four probe method in the resistance measurement in the dark without photoexcitation (e.g. installed at a specimen holder in a cryostat).

Figure 3A:
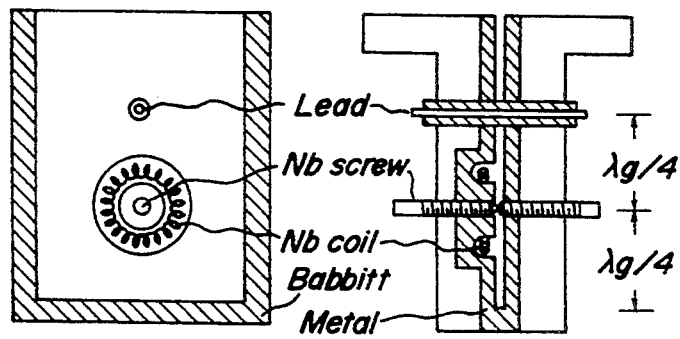
FIGS. 3A, 3B and 3C are the sectional view of a microwave SQUID and the blocking diagrams for the measurement of static magnetization.
Figure 3B:
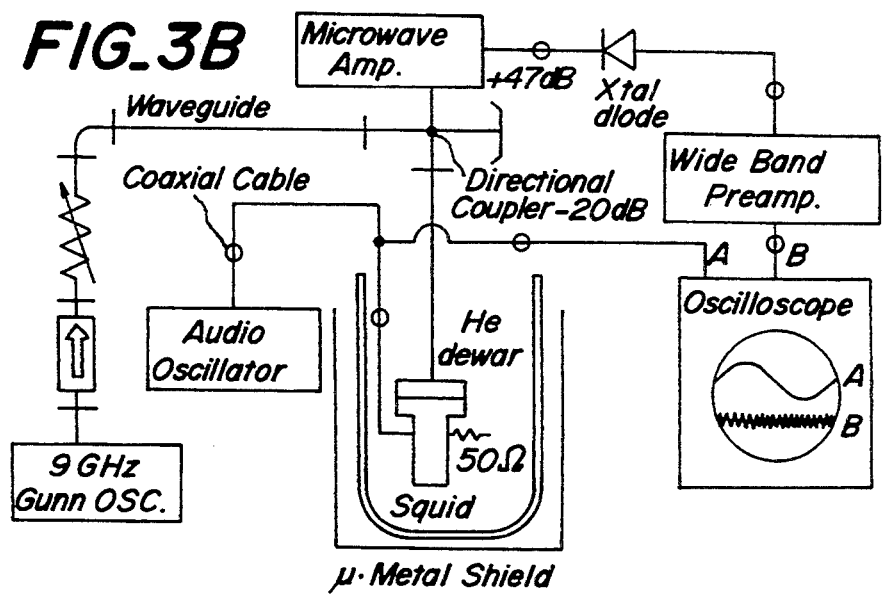
Figure 3C:
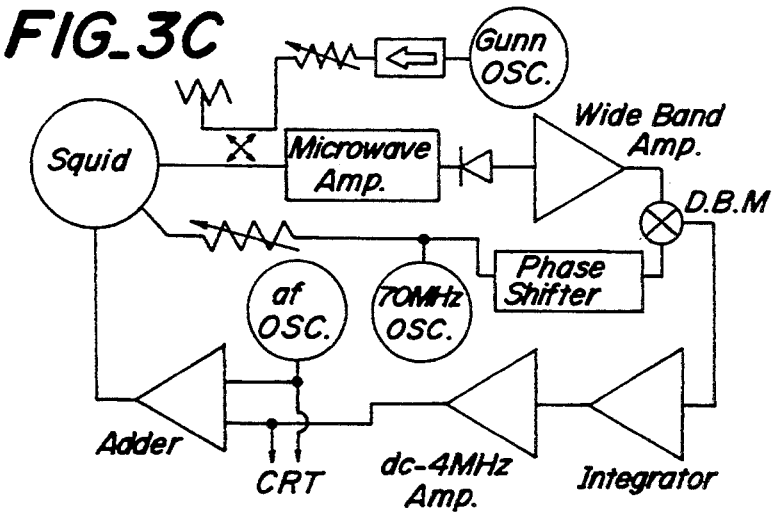

Static magnetic susceptibility or magnitude of magnetization M (T,H) can be measured at a weak field up to $H \approx 500$ Oe by using a microwave SQUID at 9 GHz band. Characteristic features of this measurement system are separately described (see FIGS. 3A, 3B and 3C).

In the case of photoconductivity measurement, a specimen was photoexcited at a wavelength range of $\lambda = 420$–$470$ nm with the use of a pulsed dye laser. Spectral response was carefully examined by paying special attention. A number of excited photocarriers is of the order of $10^6 \sim 10^8$ but the density can be $10^{12}$ $\Omega$/cm$^3$ within a thin layer of $10^{-3}$–$10^{-4}$ cm in the vicinity of a surface when an absorption coefficient is larger. Photoconductivity signals were detected in a synchronized mode with the use of a Boxcar integrator.

Experimental Result

A specimen of $Bi_2(Sr_2Ca_1)_1Cu_2O_z$ (x=0) such as Specimen No. S182 looks black, and resistance at room temperature is usually of the order of $\rho \leq 10^{-3}$ $\Omega$·cm. According to the inventor's observation, when repetitive pulse technique is applied to Specimen No. S235 (x=1, insulator), a signal of photoconductivity emerges at and grows below 80–110K or 40–60K. Origins of these emergences are probably different each other.

First, the dependence of photoconductivity $Q(\lambda,T,E)$ on the applied electric field E is almost linear up to $E \approx 4$ kV/cm at T=4.2K. FIG. 4A is the typical spectra response of pulse photoconductivity $Q(\lambda,T)$ of Specimen No. B03 of $Bi_2O_3$, and FIG. 4B is the typical spectra response of pulse photoconductivity $Q(\lambda,T)$ of Specimen No. S235 (x=1) of $Bi_2$-$La_2Y_1$-$Cu_2$-$O_z$ over a wavelength region of $\lambda \approx 420$–$670$ nm. In this connection, FIG. 4A is a new datum of photoconductivity spectra corresponding to light absorption of $Bi_2O_3$ previously observed first by the inventor throughout the world and should be used as a standard.

Figure 5C:
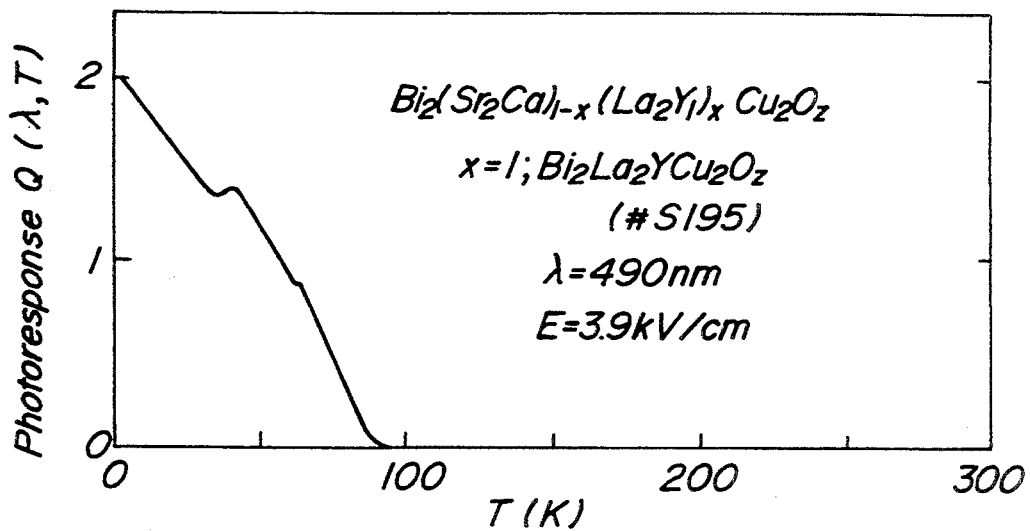
FIG. 5C is a characteristic graph showing the relation between temperature and photoconductive response of $Bi_2(Sr_2Ca_1)_{1-x}(La_2Y_1)_xCu_2O_z$ for $x=1$ as photoconductive substance.

Secondly, the temperature dependences of photoconductivity $Q(\lambda,T)$ at the wavelength range $\lambda = 420$–$680$ nm were examined for Specimen No. B03 of $Bi_2O_3$ as shown in FIG. 5A, for Specimen No. S213 of $Bi_2O_3$:$M^{2+}$, as shown in FIG. 5B and for Specimen No. S195 of an insulator $Bi_2(La_2Y_1)Cu_2O_z$ as displayed in FIG. 5C. It is surprising to recognize that conspicuous similarities definitely exist among general characteristics of mutually interrelated photoconductivities $Q(\lambda,T)$ of Specimen Nos. B03, S213 and Specimen Nos. S195, S235 (x=1 in FIG. 7). No one can fail to recognize that "photoconductive response $Q(\lambda,T)$" in specimens of an insulator or a semiconductor emerges at an absolute temperature below 80–110K and less than 40–60K together with the lowering of a temperature and monotonously increases and thereafter further increases at a temperature of less than 10K, as if superconductivity latently underlies.

Figure 5D:
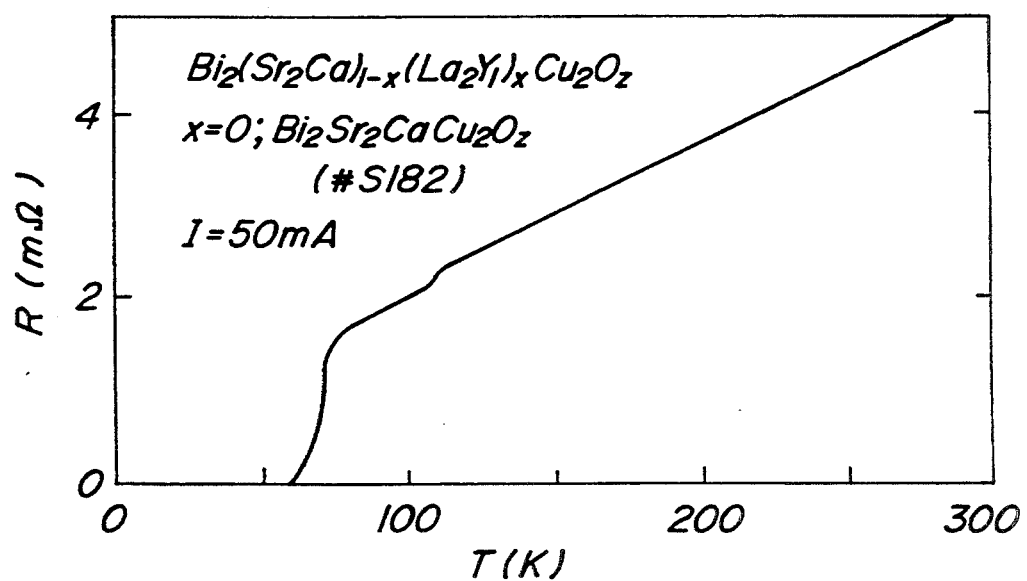
FIG. 5D is a graph showing the relation between temperature and resistance in the dark of the $Bi_2(Sr_2Ca_1)_{1-x}(La_2Y_1)_xCu_2O_z$ for $x=0$ as a superconductive substance.

Actually, FIG. 5D exemplified the dark resistivity $\lambda(T)$ of Specimen No. S182 of superconductor $Bi_2(Sr_2Ca_1)_1Cu_2$-$O_z$ as a function of temperature. One can immediately note that Specimen No. S182 becomes superconductor at and below T=80–110K and T=65–85K. With a slight shift in T, the photoconductive response $Q(\lambda,T)$ displayed in FIG. 5C has a surprisingly well one to one correspondence thereto.

FIGS. 4 and 5 only illustrate the cases for x=0 and x=1 as the both extrem ends of the $Bi_2\text{-}(Sr_2Ca_1)_{1-x}(La_2Y_1)_x\text{-}Cu_2\text{-}O_z$ system for the sake of definiteness. In general, the condition is rather complicated in 0<x<1.

Specimen No. S182 (x=0) of $Bi_2Sr_2CaCu_2O_z$ is a known superconductor. When the composition is changed from x=0 to x=1 in the order shown in Table 1, the crystalline structure varies as shown in FIG. 1, but it becomes rather simpler in S235 (x=1).

On the other hand, the temperature dependence of resistance $\rho(T)$ of these series in the dark drastically varies as shown in FIG. 6. As the composition x increases from x=0 to x=0.3, the absolute value of $\rho(T)$ becomes larger and the superconductive critical temperature Tsc simultaneously becomes lower. Further increase of x in the composition does convert the specimen into a semiconductive phase at 0.3<x<0.4. When x is even further increased, the value of $\rho$ becomes larger, the materials in that composition become insulators. Eventually, it becomes extremely difficult to measure resistance in the dark by a usual four-probes method. This difficulty in the measurement results from conditions peculiar to high resistance substance, such as non-ohmic properties of contact electrode, formation of space charge and tiny signal to noise (S/N) ratio due to a low concentration of carriers.

Figure 2A:
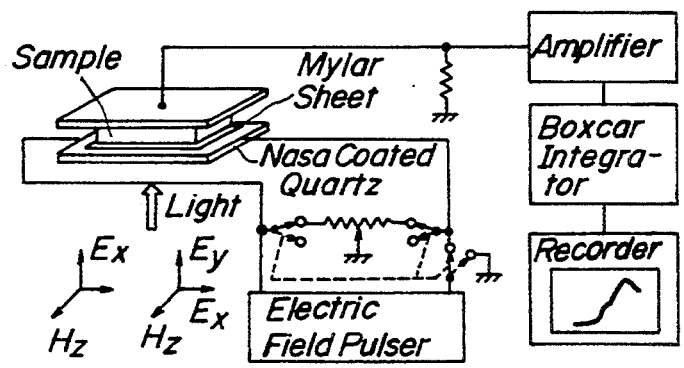
FIGS. 2A, 2B and 2C are the schematic diagrams of circuit and time sequence for the repetitive measurement of pulse photoconductivity by using blocking electrodes.
Figure 2B:
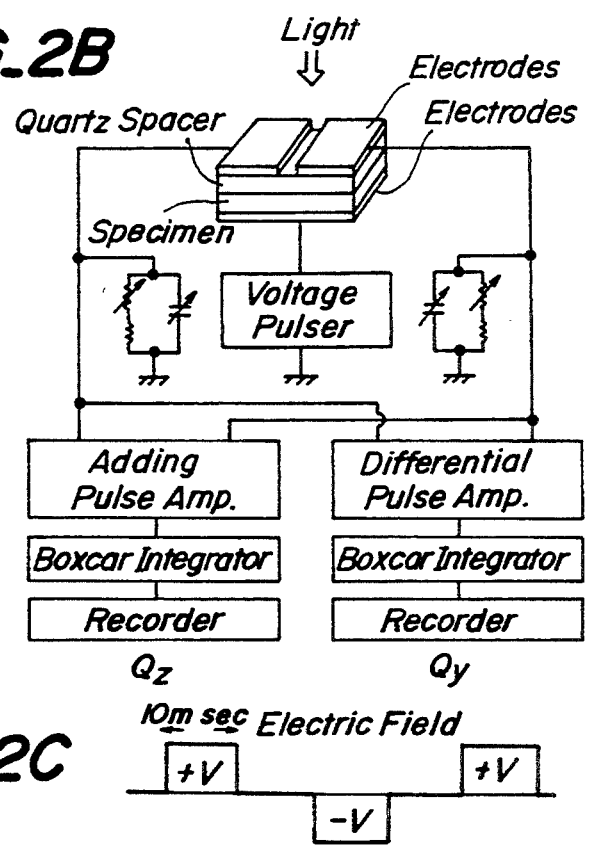
Figure 2C:
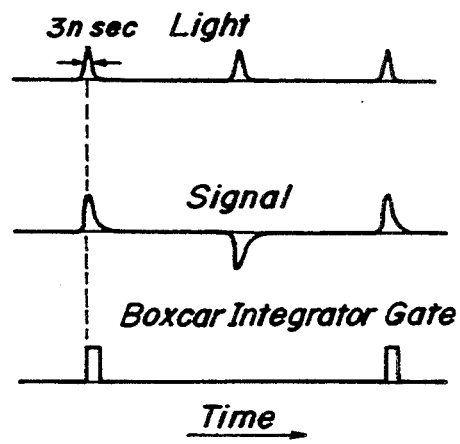

Therefore, for a conductivity measurement of specimens in these regions, one has to adopt the transient technique of pulsed photoconductivity measurement with blocking electrodes, the principle of which is explained in FIGS. 2A and 2B. This method is effective to a measurement of rather high impedance materials. Actually, as shown in FIG. 7 in case of the specimens for $0.9 \leq x1$, the photoconductivity signal $Q(T,\lambda)$ at photoexcitation with wavelength $\lambda=476\sim500$ nm becomes observable at and below a certain temperature Tpc.

It should be noted here that the value of Tsc once decreases as x increases from x=0 to x=0.3 in the superconductive region, and revealing photoconductivity after superconductor insulator transition, the value of Tpc increases again in the region from x=0.9 to x=1.0. These situations are illustrated in FIG. 8 in a form of a phase diagram like scheme for the $Bi_2\text{-}(Sr_2Ca_1)_{1-x}(La_2Y_1)_x\text{-}Cu_2O_z$ system.

FIG. 9 displays a similar diagram for the $Bi_2\text{-}Sr_2(Ca_1)_{1-x}Y_x\text{-}Cu_2\text{-}O_z$ system in the same manner as in FIG. 8. In this case, it is known that the lattice spacing continuously varies by x, but the crystalline structure never changes. Photoconductivity emerges only in the vicinity of x=0.

In any case, both superconductive and photoconductive regions have several values of the critical temperatures Tsc and TPC or the step temperatures Tps, respectively. The values of Tsc and Tps, vary with x. They slightly shift but correspond to each other across their transition regions.

It is not easy to simply understand these experimental facts. It must turn out that a heating effect of the specimen by photoexcitation is sufficiently small when if we carefully examine and estimate the effect. Specimen Nos. S195 and 235 of $Bi_2\text{-}La_2Y_1\text{-}Cu_2\text{-}O_z$ (x=1) are a semiconductor or rather an insulator even at T=300K. However, one can mainly conceive that "photoconductivity" observed by using the transient technique with the arrangement of blocking electrodes and "superconductivity" in Specimen No. S182 of a superconductor are profoundly correlated. As illustrated in FIGS. 4A, 4B and FIGS. 5A, 5B, 5C and 5D, this is probably, due to a potentiality of the insulator portions within the specimen to be convertible to superconductor by doping. However, surprising is an existence of such fact that even in an insulator Specimen No. S195, there is an "emergence of superconductive conjugate photoconductive phenomenon" to reveal an implicit correlation as if superconductivity latently underlies.

Studies of Experimental Results and Further Discussions

A specimen of the $Bi_2\text{-}(Sr_2Ca_1)_{1-x}(La_2Y_1)_x\text{-}Cu_yO_z$ system in the semiconductor or insulator region is usually gray in color. A photoconductive spectral response $Q(\lambda,T)$ shown in FIGS. 4A and 4B suggests that there exists a region similar to $Bi_2O_3$ even not necessarily in atomic layers but to some extent within the inside of the specimens of the $Bi_2\text{-}(Sr_2Ca_1)_{1-x}(La_2Y_1)_x\text{-}O_z$ system.

Optical absorption and photoconductivity of Bi2O3 itself have not been sufficiently clarified yet even by an experiment or an exciton theory. However, an exciton here is considered to be a typical example of Frenkel exciton due to charge transfer within a cation shell and neighboring anion cells. The position of fine structure in photoconductivity $Q(\lambda,T)$ of the abovementioned Bi-(SrCa)(LaY)-Cu-O system reasonably corresponds to the fundamental absorption edge structures of the basic substance $Bi_2O_3$. One recognizes several fine structures to be considered conspicuous due to excitons. For instance, the spectra of photoconductive response of $Bi_2\text{-}La_2Y_1\text{-}Cu_2\text{-}O_z$ are similar to that of the reference substance $Bi_2O_3$. In the vicinity of $\lambda=568-580$ nm in this spectra, we recognize a structure which is considered to correspond to the n=2 state in an exciton series of $Bi_2O_3$. Namely, there exists a phase similar to $Bi_2O_3$ at least in a finite proportion in the substance of the Bi-(SrCa)(LaY)-Cu-O system, which no one can ignore. Crystalline structures are slightly different from each other, but photoexcited conduction electrons and the holes are dissociated and definitely mobile (see FIG. 10A).

A conduction electron and a hole in the standard type $Bi_2O_3$ crystal are considered to form a rather "small polaron" in terms of the coupling constant $\alpha$. In any case, "an emergence of photoconductivity $Q(\lambda,T)$" in insulating specimen clearly relates to "an emergence of superconductivity", as if superconductivity is latently conjugate with a photoconductive phenomenon. Therefore, the polaron effect is at least potentially of remarkably importance as shown in FIGS. 4A, 4B and FIGS. 5A–D, whether it is a "large polaron" based on the interaction with LO (longitudinal optical type) phonon or a "small polaron" due to the Jahn-Teller effect or an intermediate coupling region based on both effects as well as the "polaron effect due to electronic polarization". Dynamical polaron effects are considered to be effective in a coherently hybridized form of elementary excitations. It is necessary to pay special attention to polarons due to electronic polarization, which are also referred to as "excitonic polarons". By examining these experimental results, we recognize a close relation between polarons and excitons.

Figure 10A:
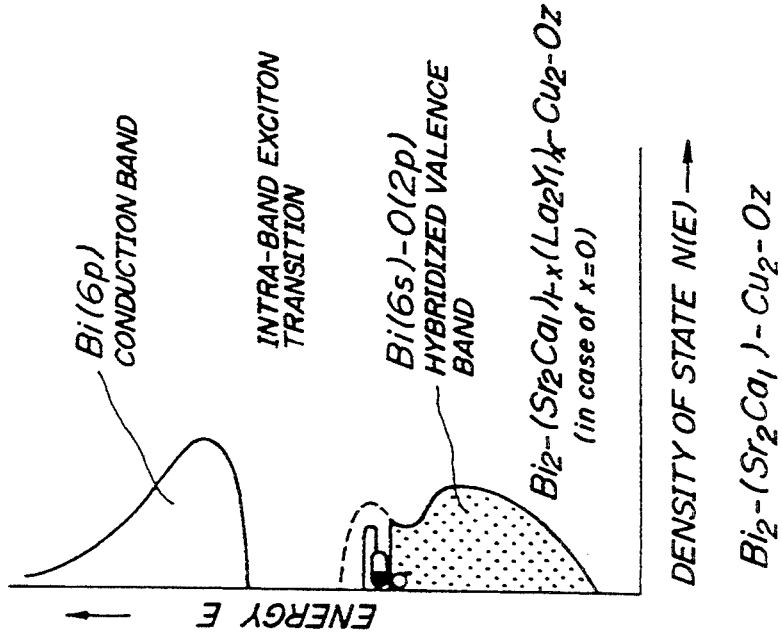
FIG. 10A is a schematic diagram of the state density N(E) as a function of energy E of the $Bi_2(Sr_2Ca_1)_{1-x}(La_2Y_1)_xCu_2O_z$ system in the case of $x=1$.
Figure 10B:
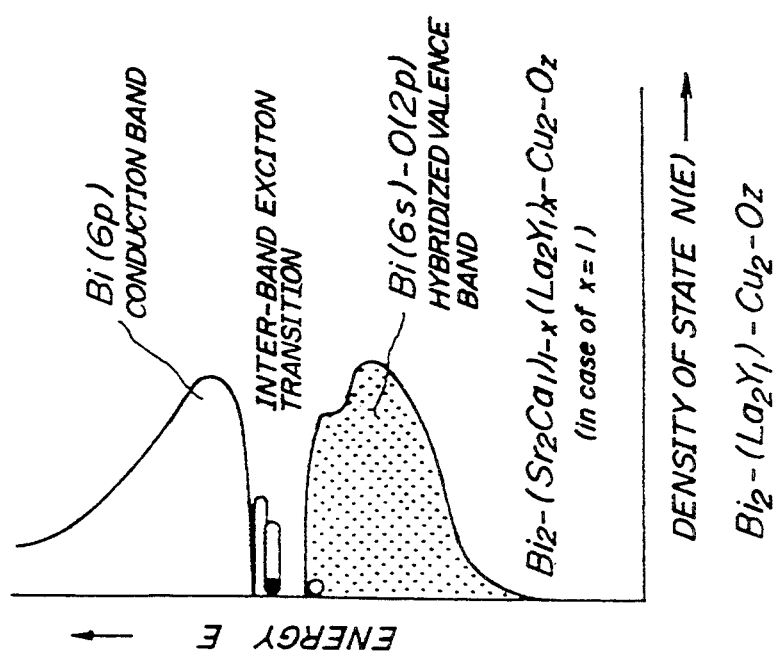
FIG. 10B is a schematic diagram of the state density N(E) as a function of energy E of the $Bi_2(Sr_2Ca_1)_{1-x}(La_2Y_1)_xCu_2O_z$ system in the case of $x=0$.

As shown in FIG. 10A, these polarons and excitons had yielded out of the optical interband transition from the hybridized valence band state of O(2p) and Bi(6s) or Bi(6p) conduction band (possibly mixed with the Cu(4s,3d) (not shown) depending on case) leaving a hole (white circle) in the $O(2p)^6Bi(6s)^1$ state with LO phonon interaction. However, as shown in FIG. 10B (x=0), a polaron in the Bi-(SrCa)(LaY)-Cu-O can be created not by optical excitation but by substitution of ($La_2Y_1$) by $Sr_2Ca_1$. Here, FIG. 10B shows the case of a superconductor with x=0 with intraband exiton, which already has been known. There has recently been proposed that the hybridized valence electron state is caused by O(2p)Bi(6p), and the conduction band is caused by Bi(6d). Situation here, however, remains without substantial change.

Holes in the hybridized bands of O(2p) and Bi(6s) in $Bi_2-(Sr_2Ca_1)_{1-x}(LaY)_x-Cu_y-O_z$ can be created from the ground state of a many-body system either by an interband optical transition or by doping additional element together with interband excitation. But, here, a correlation effect between electrons is extremely important in any case. One must pay serious attention not only to the dynamical valence fluctuation between $Bi^{3+}$ and $Bi^{5+}$ and between $Cu^{2+}$ and $Cu^{3+}$, but also further to the dynamical valence fluctuation between $Cu^{1+}$ and $Cu^{2+}$, particularly between $Bi^{3+}$ and $Bi^{4+}$. Therefore, to clarify the mechanism of high-Tc superconductivity, there exists a sufficient reason to consider a potential role of an ensemble of polarons, whether large or small, particularly an ensemble of polarons closely associated with excitons. The ensemble of the united polarons and excitons here is considered to be a set of bipolarons and polaronic excitons and/or excitonic polarons due to the dynamical electron-phonon interaction and the dynamical electron correlation, namely, "exciton-mediated bipolaron". As shown in FIG. 4B, it was confirmed that the photoconductive responses $Q(\lambda,T)$ of the Bi-(SrCa)(LaY)-Cu-O system have wavelength dependence in the region of 420–670 nm similar to the photoconductive spectra of the basic substance $Bi_2O_3$ shown in FIG. 4A. Therefore, by studying the elementary excitations, we can approach to clarify the nature of the superconductive ground state, irrespective of an enormous difference in the carrier densities. To our knowledge, the present invention based on these experimental results is the first experimental confirmation that the Bi-(SrCa)(LaY)-Cu-O oxide system consists of superconductive conjugate photoconductive substance with real superconductors. It was experimentally and clearly confirmed that the mechanism due to the polarons and excitons underlies inherently commonly over the present substances and the oxide-series high temperature superconductor.

In case of studying the physical properties of the Bi-(SrCa)(LaY)-Cu-O superconductive photoconductive substance according to the present invention, the inventor has found that the critical temperatures 115K–105K (high Tc phase) and 85–65K (low Tc phase) for starting superconductivity expected in the known superconductor well correspond to the temperature for revealing the superconductivity and the temperature for revealing photoresponse in the superconductive conjugate photoconductive substance according to the present invention.

The inventor has found for the first time that the Bi-(SrCa)(LaY)-Cu-O oxide superconductive photoconductive substance has profound correlation to "superconductivity" at x=0 and "conjugate photoconductivity" in the proximity of x=1 by the above selection of x. Therefore, the inventor reconfirmed the existence of the dynamical mechanism due to polaron and exciton in high temperature superconductivity, that is, the dynamical mechanism due to "exciton-mediated bipolarons".

By these studies and discussions, the inventor proposes several possibilities in technological aspects, FIG. 11 is a schematic cross section to exemplify a constructed form of a superconductive optoelectronic element according to the present invention. In the present embodiment, we can explain the case to devise the element as a superconductive phototransistor ($V_G \neq 0$). On the substrate 1, e.g., made of $SrTiO_3$, is formed a photoconductive gate region 2. The gate region 2 comprises a superconductive-conjugate photoconductive Bi-(SrCa)(LaY)CuO layer of 0.2 $\mu$m–1.0 mm in width and 1–10 $\mu$m in thickness. This Bi-(SrCa)(LaY)CuO layer provides special photoconductivity at photoexcitation in the wavelength region of 420–670 nm. at and below a critical temperature of 105–115K and 65–85K of a certain superconductive material consisting of Bi-(SrCa)(LaY)CuO. On both sides of the gate region 2 are formed a source region 3 and a drain region 4. These source region 3 and drain region 4 are composed of a Ba(SrCa)(LaY)CuO superconductive layer showing superconductivity at and below a critical temperature of 105–115(K) and 65–85K. Moreover, on the gate region 2, the source region 3 and the drain region 4 is formed an $SiO_2$ layer 5 of 1 $\mu$m in thickness with optically transparent and electrically insulating properties, and a NESA glass layer 6 with bias electrodes is formed thereon. Between the bias electrode on the NESA glass layer and the source region 3 is connected a bias source $V_G$ and between the source region 3 and the drain region 4 are connected a bias source $V_{SD}$ and an output resistance R. In addition, it is possible to construct the regions 3, 4 of superconductive Ba(SrCa)(LaY)CuO system from the photoconductive Ba(SrCa)(LaY)CuO region 2 by continuously varying the composition x of (LAY) in the Ba-(SrCa)(LaY)CuO superconductive photoconductive substance from x=1 to 0.4 and to x=0.

When such a superconductive optoelectronic element prepared via the above process of construction is cooled down to and below the critical temperatures of 105–115(K) of a material layer of Ba-(SrCa)(LaY)CuO and the temperature below 65–85K with an incident light of an excitation wavelength range, photocarriers density in proportion to the intensity of incident light are realized in the gate region 2. The photocarriers accelerated by the bias $V_{SD}$ between the source and drain yield a current and result in an output voltage across the output resistance R. Moreover, the density of photocarriers is controlled via the light intensity and the bias source $V_G$, so that the bias source $V_G$ can be set appropriately in accordance with a purpose. With the above construction, it is possible to obtain an output characteristics in accordance with the incident light intensity, so as to realize a superconductive optical switching element. The source region and the drain region are particularly made of superconductive material, so that a substantially new superconductive optoelectronic element can be realized without heat dissipation during operation.

FIG. 12 is a schematic diagram showing an embodiment of integrating the superconductive optoelectronic elements shown in FIG. 11 in the form of an alley. When the superconductive optoelectronic elements according to the present invention are integrated at high density in the form of one dimensional or two dimensional alley, it is possible to materialize a device like a camera by minimizing heat dissipation during operation with appropriate superconductive wirings among various elements as a background. It is also possible to materialize the main portions for signal detection in an optical computer for performing a spatially parallel operation. There is also a possibility of multi-channel operation by selecting the wavelength of an incident light source used.

Figure 13A:
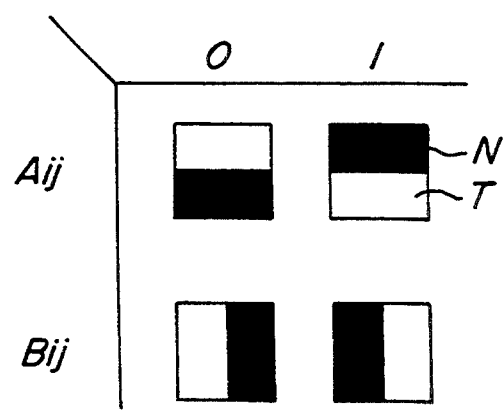
FIGS. 13A and 13B are a schematic diagram to illustrate the construction of the spatial parallel operation device with the use of the superconductive optoelectronic element alley according to the present invention.
Figure 13B:
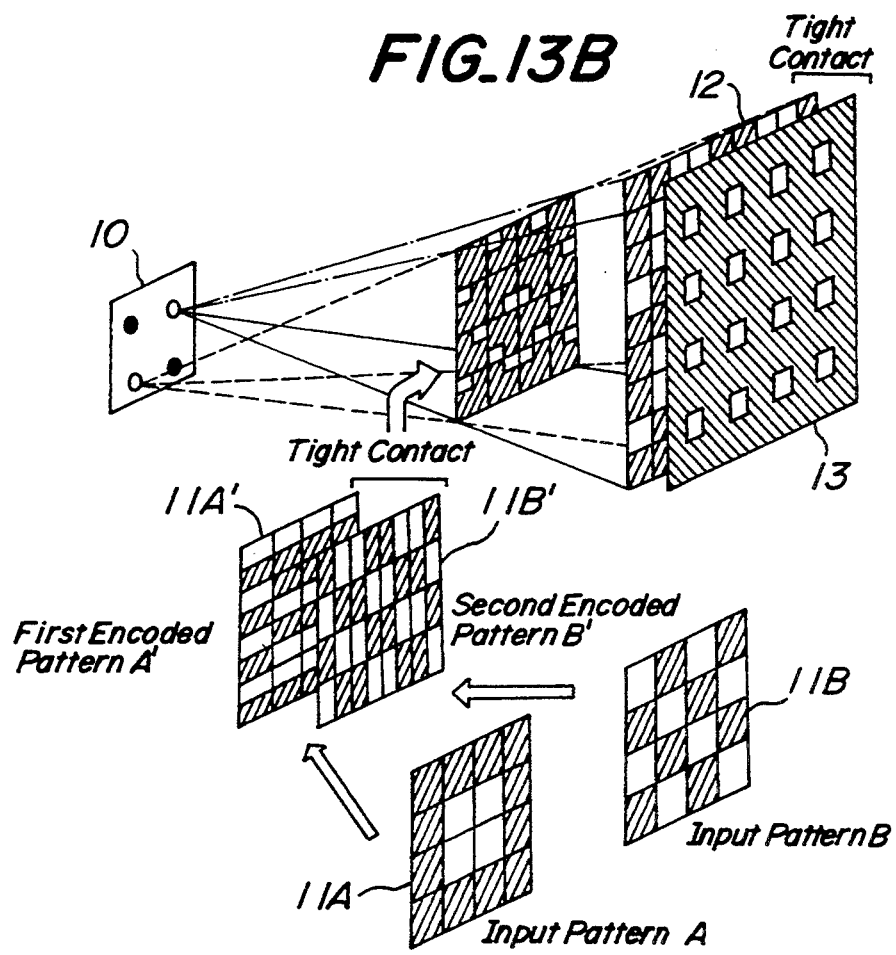

FIGS. 13A and 13B schematically illustrate an embodiment of optical operation in the projectioncorrelation optical system of the spatially parallel optical computer [see T. Yatagai: OYO BUTSURI (Applied Physics in Japanese), 57 (1988) p. 1136] with the use of superconductive optoelectronic elements according to the present invention. A plurality of optical signals made in parallel from an alley-like light source 10 are projected onto an encoded image mask pattern 11. The image mask pattern 11 carries encoded image information in a mask fashion. A plurality of light beams passed through the encoded image mask pattern 11 are incident in parallel to each element corresponding to a composite mask optical element alley 13 via a correlation image screen 12. Since an encoded signal modulated by the mask screen is formed in each optical element, an operation result is obtained from photoelectric output signal from each optical element. If each element of the optical element alley 13 is constructed with the superconductive optoelectronic element according to the present invention, it is possible to carry out a parallel optical operation under the condition of minimizing heat dissipation during the operation.

The embodiment described above represents the three-terminal element as an example, but a two-terminal element also can be realized. Thus, the photocarrier created at $V_G=0$ may be influenced by a superconductive proximity effect irrespective of a small coherence length via superconductive photoconductivity, so that the superconductive optoelectronic element can be served as a superconductive Josephson junction element based on light irradiation. Such a two-terminal element can hold a position as "superconductive photoconductive or optically controlled Josephson junction device". In this case, it is necessary to appropriately select gate width and incident light amount.

It is possible to arrive at the following conclusion from these results. As a result of extensive studies, by applying not only the D.C. 4-probe method but also method of the repetitive pulse photoconductivity measurement for studying transport phenomena in the temperature range of T=4.2K–300K, and by using the microwave SQUID for static magnetization measurement, the inventor confirmed that "photoconductivity" is closely correlated and conjugated with "superconductivity (zero resistance and diamagnetism)" and invented "the superconductive conjugate photoconductive substance $Bi_2$-$(Sr_2Ca_1)_{1-x}(La_2Y_1)_x$-$Cu_y$-$O_z$ system", $0.4 \leq x \leq 1$, $y=2$ and $z=9$–$10.5$, and also invented a method for producing the same. Besides, the inventor invented a superconductive optoelectronic element and device by using the same. The present invention has been developed in parallel with such theoretical consideration that "dynamical mechanism due to polaron and excitons", namely, the mechanism due to "exciton-mediated bipolarons", is proposed for "the high temperature superconductivity", and these new materials will develop the up-to-date scientific technical field of "superconductive optoelectronics" which directly controls superconductivity by light.

Although the invention has been described with a certain degree of particularity, it is understood that the present disclosure has been made only by way of example and that numerous change in details may be resorted to without departing from the scope of the invention as hereinafter claimed.

What is claimed is:

1. A superconductive-conjugate photoconductive substance of a Bi-SrCa(LaY)-Cu-O oxide with a composition having a general chemical formula of

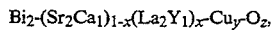

$$Bi_2\text{-}(Sr_2Ca_1)_{1-x}(La_2Y_1)_x\text{-}Cu_y\text{-}O_z,$$

where $0.4 \leq x \leq 1$, $y=2$ and $z=9$–$10.5$, wherein, when said substance is at a temperature below the critical temperature of a Bi-SrCa(LaY)-Cu-O superconductor, said substance is (A) a conductor when exposed to light, said conductor having a photoconductivity $Q(\lambda,T)$ conjugate with superconductivity of the Bi-SrCa(LaY)-Cu-O superconductor at photoexcitation in an optical wavelength range $\lambda$) of 420–670 nm, and (B) an insulator or a semiconductor when not exposed to light.

* * * * *